United States Patent
Zhu et al.

(10) Patent No.: US 9,911,620 B2
(45) Date of Patent: Mar. 6, 2018

(54) METHOD FOR ACHIEVING ULTRA-HIGH SELECTIVITY WHILE ETCHING SILICON NITRIDE

(71) Applicant: Lam Research Corporation, Fremont, CA (US)

(72) Inventors: Helen H. Zhu, Fremont, CA (US); Linda Marquez, San Jose, CA (US); Faisal Yaqoob, Fremont, CA (US); Pilyeon Park, Santa Clara, CA (US); Ivan L. Berry, III, San Jose, CA (US); Ivelin A. Angelov, Sunnyvale, CA (US); Joon Hong Park, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/676,710

(22) Filed: Apr. 1, 2015

(65) Prior Publication Data
US 2016/0247688 A1   Aug. 25, 2016

Related U.S. Application Data

(60) Provisional application No. 62/119,670, filed on Feb. 23, 2015.

(51) Int. Cl.
*H01L 21/311* (2006.01)
*H01L 21/67* (2006.01)
*H01J 37/32* (2006.01)

(52) U.S. Cl.
CPC .. *H01L 21/31116* (2013.01); *H01J 37/32357* (2013.01)

(58) Field of Classification Search
CPC ......... H01L 21/31116; H01L 21/67069; H01L 21/32357; H01J 37/32357
See application file for complete search history.

(56) References Cited

U.S. PATENT DOCUMENTS

| 4,374,698 A | 2/1983 | Sanders et al. |
| 4,431,477 A | 2/1984 | Zajac |
| 4,793,897 A * | 12/1988 | Dunfield ................... C23F 4/00 204/192.37 |
| 6,060,400 A | 5/2000 | Oehrlein et al. |
| 6,074,959 A * | 6/2000 | Wang ................ H01L 21/31116 216/68 |
| 6,376,386 B1 | 4/2002 | Oshima |

(Continued)

FOREIGN PATENT DOCUMENTS

| EP | 0 424 299 A2 | 4/1991 |
| EP | 0 424 299 A3 | 4/1991 |

(Continued)

OTHER PUBLICATIONS

U.S. Appl. No. 14/576,020, filed Dec. 18, 2014, entitled "Selective Nitride Etch."

(Continued)

*Primary Examiner* — Duy Deo
*Assistant Examiner* — Mahmoud Dahimene
(74) *Attorney, Agent, or Firm* — Weaver Austin Villeneuve & Sampson LLP

(57) ABSTRACT

Methods of selectively etching silicon nitride on a semiconductor substrate by providing silicon to the plasma to achieve high etch selectivity of silicon nitride to silicon-containing materials are provided. Methods involve providing silicon from a solid or fluidic silicon source or both. A solid silicon source may be upstream of a substrate, such as at or near a showerhead of a process chamber, or in a remote plasma generator. A silicon gas source may be flowed to the plasma during etch.

20 Claims, 8 Drawing Sheets

(56) References Cited

U.S. PATENT DOCUMENTS

| | | | |
|---|---|---|---|
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,338,907 B2 | 3/2008 | Li et al. | |
| 8,889,024 B2 * | 11/2014 | Watanabe | H01L 21/3065 216/72 |
| 8,956,980 B1 | 2/2015 | Chen et al. | |
| 9,318,343 B2 * | 4/2016 | Ranjan | H01L 21/31116 |
| 2002/0160125 A1 | 10/2002 | Johnson et al. | |
| 2002/0175144 A1 * | 11/2002 | Hung | H01L 21/31116 216/67 |
| 2005/0155625 A1 | 7/2005 | Jangjian et al. | |
| 2009/0221117 A1 | 9/2009 | Tan et al. | |
| 2010/0178770 A1 | 7/2010 | Zin | |
| 2012/0149213 A1 | 6/2012 | Nittala et al. | |
| 2012/0238102 A1 | 9/2012 | Zhang et al. | |
| 2013/0029494 A1 * | 1/2013 | Sasaki | H01J 37/32192 438/724 |
| 2014/0080308 A1 | 3/2014 | Chen et al. | |
| 2014/0141621 A1 | 5/2014 | Ren et al. | |
| 2014/0248780 A1 | 9/2014 | Ingle et al. | |
| 2014/0262038 A1 | 9/2014 | Wang et al. | |
| 2016/0181116 A1 | 6/2016 | Berry, III et al. | |

FOREIGN PATENT DOCUMENTS

| | | | |
|---|---|---|---|
| EP | 0838842 A2 * | 4/1998 | H01J 37/32082 |
| WO | WO 00/40776 | 7/2000 | |
| WO | WO 2011/051251 | 5/2011 | |

OTHER PUBLICATIONS

U.S. Office Action dated Oct. 5, 2015 issued in U.S. Appl. No. 14/576,020.

Blain et al. (Jul./Aug. 1996) "Role of nitrogen in the downstream etching of silicon nitride," Journal of Vacuum Science & Technology A, 14(4):2151-2157.

Blain (Mar./Apr. 1999) "Mechanism of nitrogen removal from silicon nitride by nitric oxide," Journal of Vacuum Science & Technology A, 17(2):665-667.

Kastenmeier et al. (Nov./Dec. 1999) "Highly selective etching of silicon nitride over silicon and silicon dioxide," J. Vac. Sci. Technol. A, American Vacuum Society,17 (6) :3179-3184.

Kastenmeier et al. (Sep./Oct. 1996) "Chemical dry etching of silicon nitride and silicon dioxide using CF4/O2/N2 gas mixtures," J. Vac. Sci. Technol. A 14(5):2802-2813.

Oehrlein et al. (1996) "Study of plasma—surface interactions: chemical dry etching and high-density plasma etching," Plasma Sources Sci. Technol. 5:193-199.

Tajima et al. (2013) "Room-Temperature Si Etching in NO/F2 Gases and the Investigation of Surface Reaction Mechanisms," The Journal of Physical Chemistry C, 117:5118-5125.

Yun et al. (2007) "Large Etch Rate Enhancement by NO-Induced Surface Chemical Reaction during Chemical Dry Etching of Silicon Oxide in F2 Remote Plasmas," Journal of the Electrochemical Society, 154(4):D267-D272.

U.S. Final Office Action dated Feb. 26, 2016 issued in U.S. Appl. No. 14/576,020.

U.S. Office Action dated Sep. 23, 2016 issued in U.S. Appl. No. 14/576,020.

European Extended Search Report dated May 30, 2016 issued in EP 15 199 363.1.

* cited by examiner

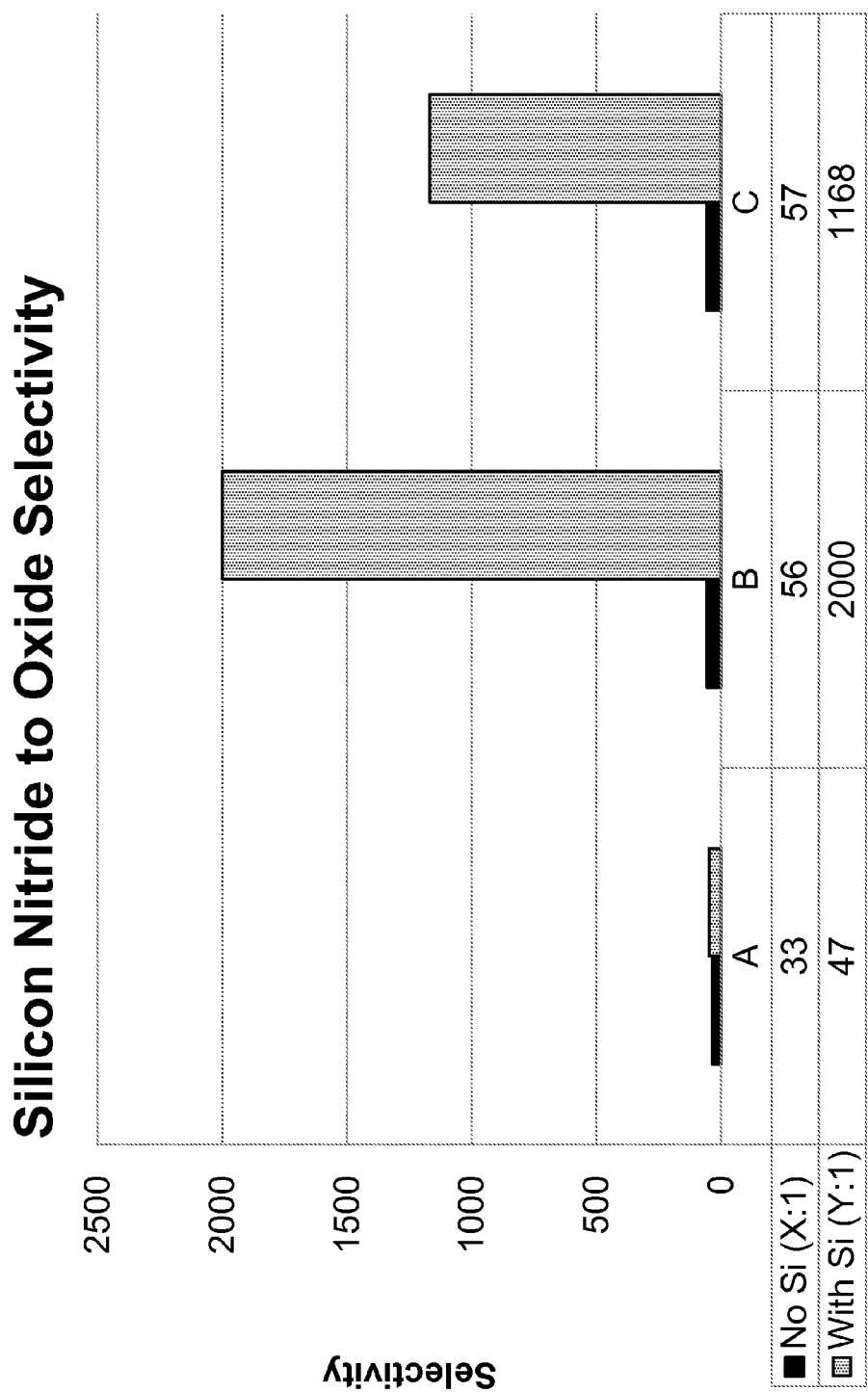

METHOD FOR ACHIEVING ULTRA-HIGH SELECTIVITY WHILE ETCHING SILICON NITRIDE

CROSS-REFERENCE TO RELATED APPLICATION

This application claims benefit of U.S. Provisional Patent Application No. 62/119,670, filed Feb. 23, 2015, and titled "METHOD FOR ACHIEVING ULTRA-HIGH SELECTIVITY WHILE ETCHING SILICON NITRIDE," which is incorporated by reference herein in its entirety and for all purposes.

BACKGROUND

Semiconductor fabrication often involves patterning schemes and other processes whereby silicon nitride is selectively etched to prevent etching of other exposed surfaces of a substrate. As device geometries become smaller and smaller, high etch selectivity processes are desired to achieve effective plasma etching of openings in dielectric layers such as silicon nitride.

SUMMARY

Provided herein are methods and apparatuses for etching films. One aspect involves a method of etching silicon nitride on a substrate, the method including: (a) introducing a fluorinating gas to a plasma generator and igniting a plasma to form fluorine-containing etching species; (b) providing silicon to the plasma from a silicon source; and (c) exposing the silicon nitride to the etching species to selectively etch the silicon nitride relative to other silicon-containing materials on the substrate.

The silicon source may be provided to the plasma upstream of the substrate. In some embodiments, the silicon source is provided to the plasma in a remote plasma generator. Alternatively or in addition the silicon source may be provided to the plasma between the substrate and a showerhead of a chamber housing the substrate. The silicon source may be provided to the plasma at or near a showerhead of a chamber housing the substrate.

The silicon source may include two or more silicon sources. In various embodiments, the silicon source is a solid. Examples of silicon sources include silicon-containing compounds, such as quartz, silicon, silicon germanium, silicon carbide, and silicon oxide. In some embodiments, the silicon source is an adapter ring including silicon. In some embodiments, the silicon source is a gas diffuser including silicon.

The substrate may be housed in a chamber including a showerhead, which may include silicon. In some embodiments, the silicon source is attached to a wall of the plasma generator.

In various embodiments, the silicon source is fluidic, and may be a silicon-containing compound. For example, at least about 0.5% (volumetric) of a total flow of gases into a chamber housing the substrate may be the silicon source. Examples of fluidic silicon sources include silane, disilane, silicon tetrafluoride, tetrachlorosilane, tetraethyl orthosilicate, and tetramethylsilane.

In some embodiments, the fluorinating gas includes a non-polymerizing fluorine-containing compound. Example fluorinating gases include $F_2$, $SiF_6$, $CF_4$, $CHF_3$, $CH_2F_2$, $NF_3$, and combinations thereof.

The silicon source may scavenge atomic fluorine generated in the etching species. In various embodiments, the other silicon-containing materials may be silicon oxide, poly-silicon, or silicon.

In various embodiments, the method also includes introducing one or more oxidant gases during (b). Example oxidant gases include oxygen, nitrous oxide, nitric oxide, nitrogen dioxide, nitrogen, and combinations thereof.

Another aspect involves a method of processing a substrate, the method including: selectively etching silicon nitride relative to other silicon-containing materials on the substrate by providing silicon to a plasma from a silicon source, where the plasma forms an etching species used to selectively etch the silicon nitride.

Another aspect involves an apparatus for processing semiconductor substrates, the apparatus including: (a) one or more stations, each station including a showerhead and a pedestal for holding a substrate including silicon nitride; (b) at least one outlet for coupling to a vacuum; (c) one or more process gas inlets for coupling to gas sources; (d) a silicon source; (e) a plasma generator; and (f) a controller for controlling operations in the apparatus, including machine-readable instructions for: (i) introducing gases including a fluorinating gas to the plasma generator and igniting a plasma to form an etching species; (ii) introducing the etching species to the one or more stations, where the silicon source is provided to the plasma during at least one of (i) and (ii).

The silicon source may include two or more silicon sources, each of which is either a solid or gas. In some embodiments, the silicon source is upstream of the substrate. The silicon source may be located at or near the showerhead of the one or more stations.

In various embodiments, the silicon source is a solid. For example, the silicon source may be a gas diffuser. In some embodiments, the silicon source is quartz. Example silicon sources include silicon-containing compounds such as silicon, silicon germanium, silicon carbide, and silicon oxide.

In various embodiments, the silicon source is fluidic. For example, the silicon source may be a silicon-containing compound such as silane, disilane, silicon tetrafluoride, tetrachlorosilane, tetraethyl orthosilicate, and tetramethylsilane. In some embodiments, at least about 9% of the composition of gases used in (i) includes the silicon source.

Example fluorinating gases include $F_2$, $SiF_6$, $CF_4$, $CH_2F_2$, $NF_3$, and combinations thereof. In some embodiments, the plasma generator includes a multi-zone coil and the silicon source includes one or more adapter rings in the plasma generator located at or near one or more zones of the multi-zone coil.

In various embodiments, the gases in (i) include an oxidant. Example oxidants include oxygen, nitrogen, nitrous oxide, nitrogen dioxide, and nitric oxide.

These and other aspects are described further below with reference to the drawings.

BRIEF DESCRIPTION OF THE DRAWINGS

FIGS. 6A and 6B are bar graphs of results from experiments conducted in accordance with disclosed embodiments.

DETAILED DESCRIPTION

Figure 1:
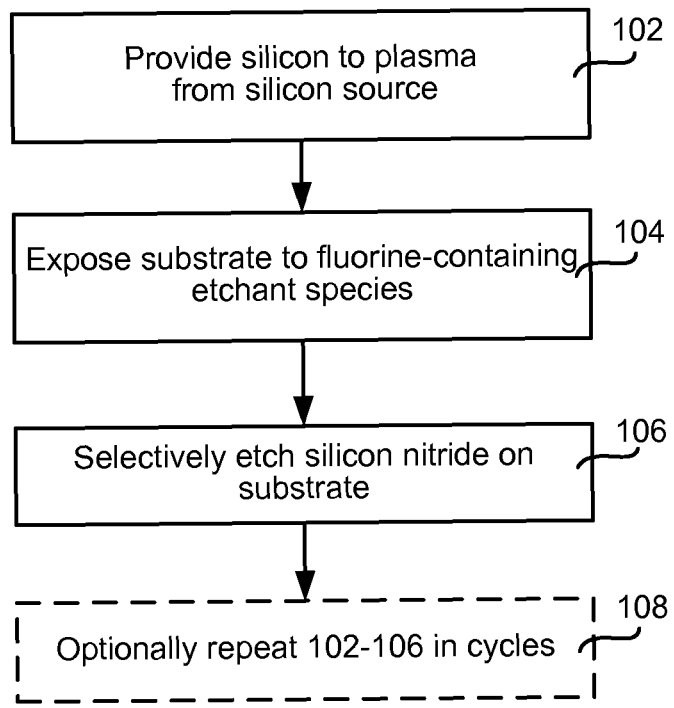
FIG. 1 is a process flow diagram depicting operations of a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve patterning and etching of various materials, such as silicon nitride. For example, silicon nitride may be etched, with the etch selective to underlying and/or overlying layers, during fabrication of a semiconductor device structure or contact after the silicon nitride is used as an etch stop layer or a mask in a patterning process. However, various conventional silicon nitride etch processes such as wet etch methods using hot orthophosphoric acid, ion bombardment, or sputtering may cause damage to exposed dielectric components of the substrate, such as silicon oxide. Some conventional dry etch processes involve introducing highly polymerizing, carbon-based gases during etch to form a thin protection layer on the surface of an exposed silicon oxide or silicon layer, but such processes may cause defects and increase the top-to-bottom ratio of a pattern and increase the pattern loading. Defects may lead to pattern-missing to the extent that the device may be rendered useless. As a result, conventional techniques are often unsuitable for selectively etching silicon nitride.

Provided herein are methods of selectively etching silicon nitride by providing silicon to a plasma during the etch process. The methods provided herein can also reduce the use of polymerization to achieve high etch selectivity. Silicon is provided to the plasma from a silicon source, which may be a solid source, a fluidic source, or a combination of both. Disclosed embodiments improve etch selectivity of silicon nitride to silicon-containing materials, such as silicon oxide and silicon (including polysilicon, amorphous silicon, and crystalline silicon) for a variety of etch chemistries and at various pressures, temperatures, and plasma powers. For example, in some embodiments, etch selectivity of silicon nitride to silicon oxide or poly-silicon may be greater than 100:1, 1000:1 or 5000:1. In most relevant applications, 1000:1 or even higher selectivity can be achieved.

The disclosed embodiments are useful in manufacturing multilayer structures that include various dielectric, semiconductor, or metal layers. Example dielectric materials include silicon nitrides, silicon oxy-nitrides, silicon dioxide, doped silicon oxides such as fluorinated silicon oxides (FSG), silicate glasses such as boron phosphate silicate glass (BPSG) and phosphate silicate glass (PSG), oxides of silicon deposited by atomic layer deposition (ALD), ALD-deposited layers of nitrides of silicon, organic siloxane polymers, carbon-doped silicate glasses, fluorinated carbon-doped silicate glasses, silsequioxane glasses, diamond-like amorphous carbon, and carbon-doped silica glasses. Other suitable dielectric materials may form one or more layers in the multilayer structures. Examples of semiconductor layers include silicon, silicon germanium, and germanium. Such multilayer structures can overlie an intermediate layer such as a barrier layer and a conductive or semiconductive layer such as polycrystalline silicon, metals such as aluminum, copper, titanium, tungsten, molybdenum, or alloys thereof; nitrides such as titanium nitride; and metal silicides such as titanium silicide, cobalt silicide, tungsten silicide, and molybdenum silicide.

Figure 3:
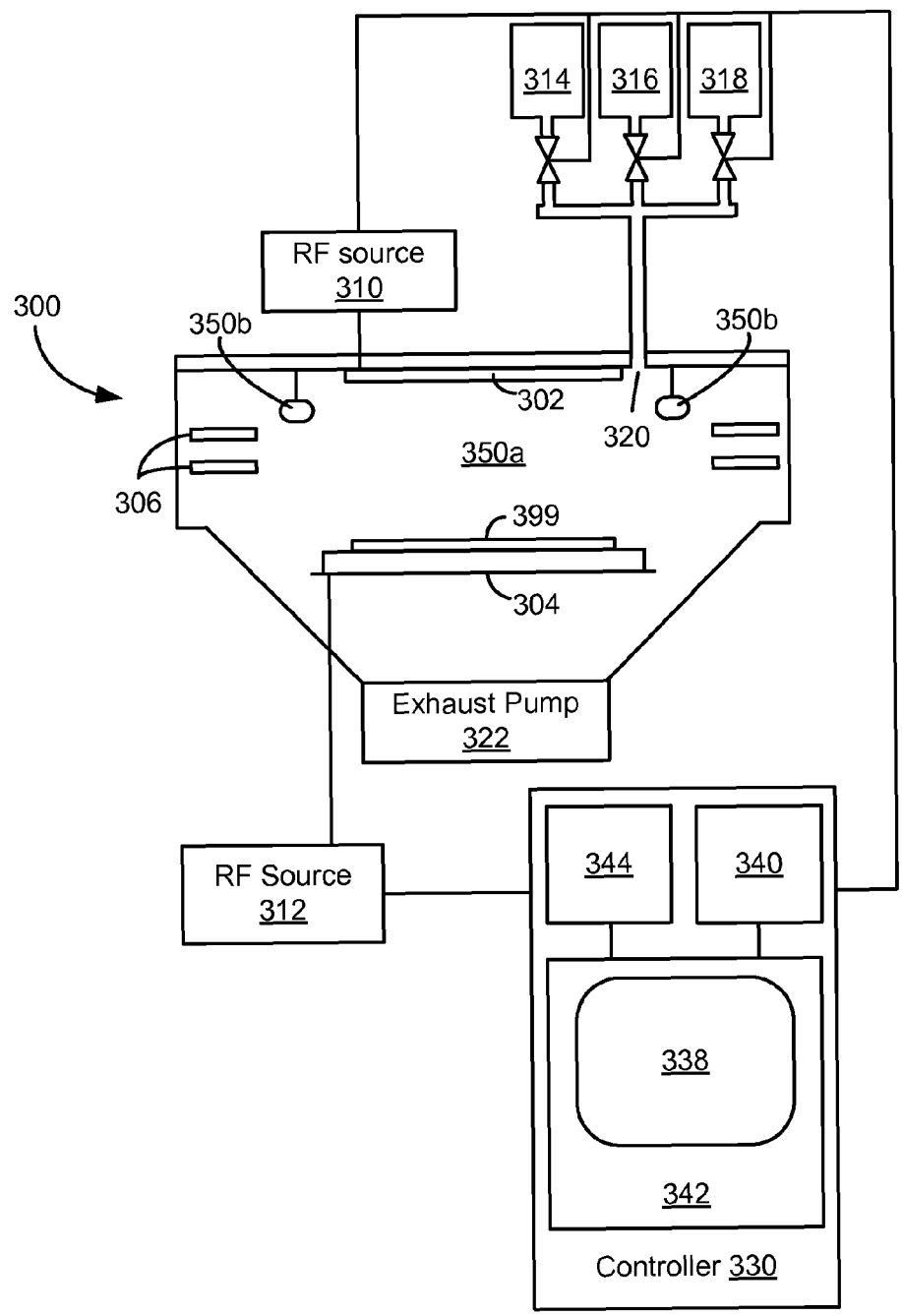
FIGS. 3, 4 and 5 are schematic diagrams of examples of process chambers for performing methods in accordance with disclosed embodiments.
Figure 4:
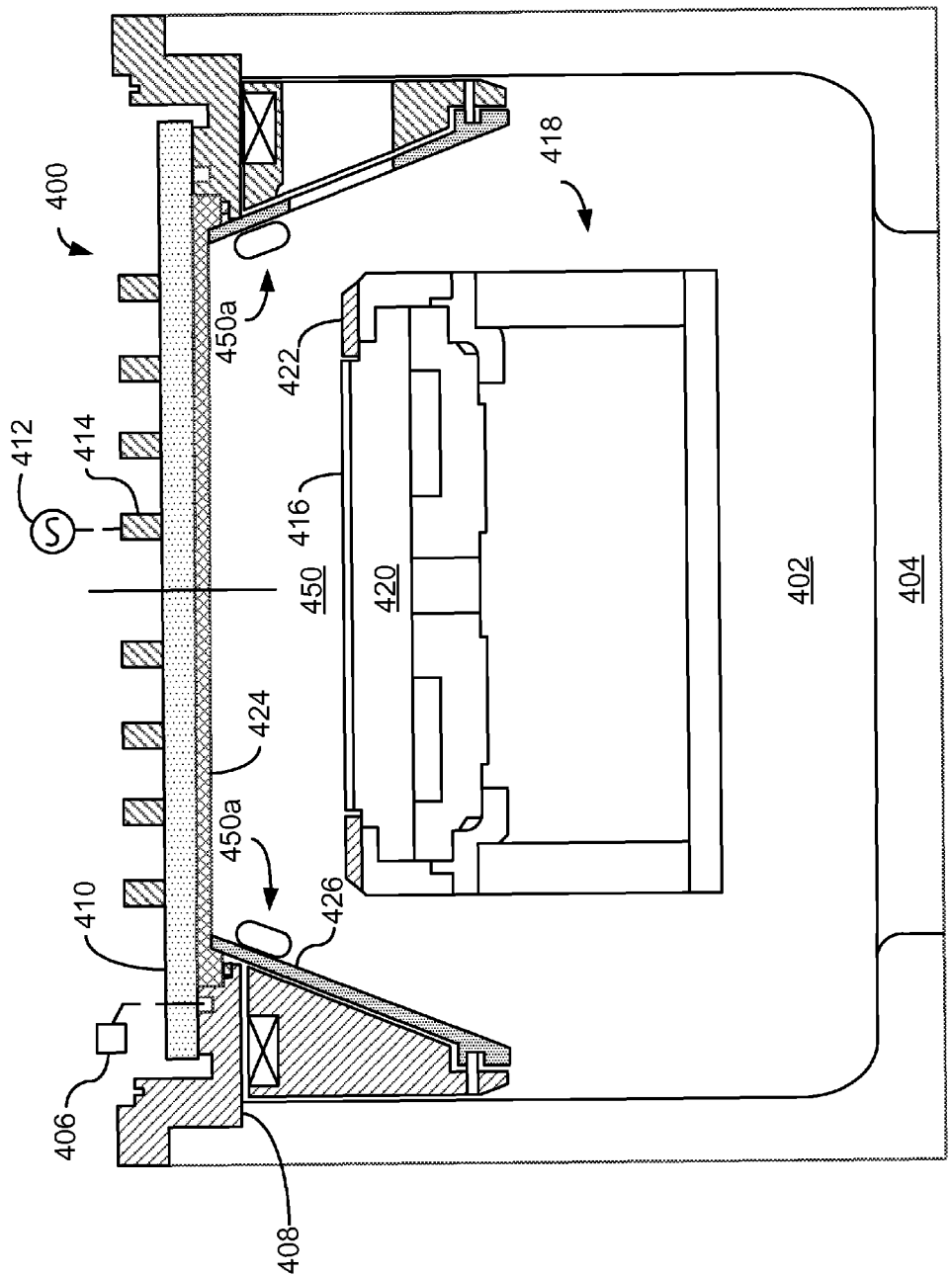
Figure 5:
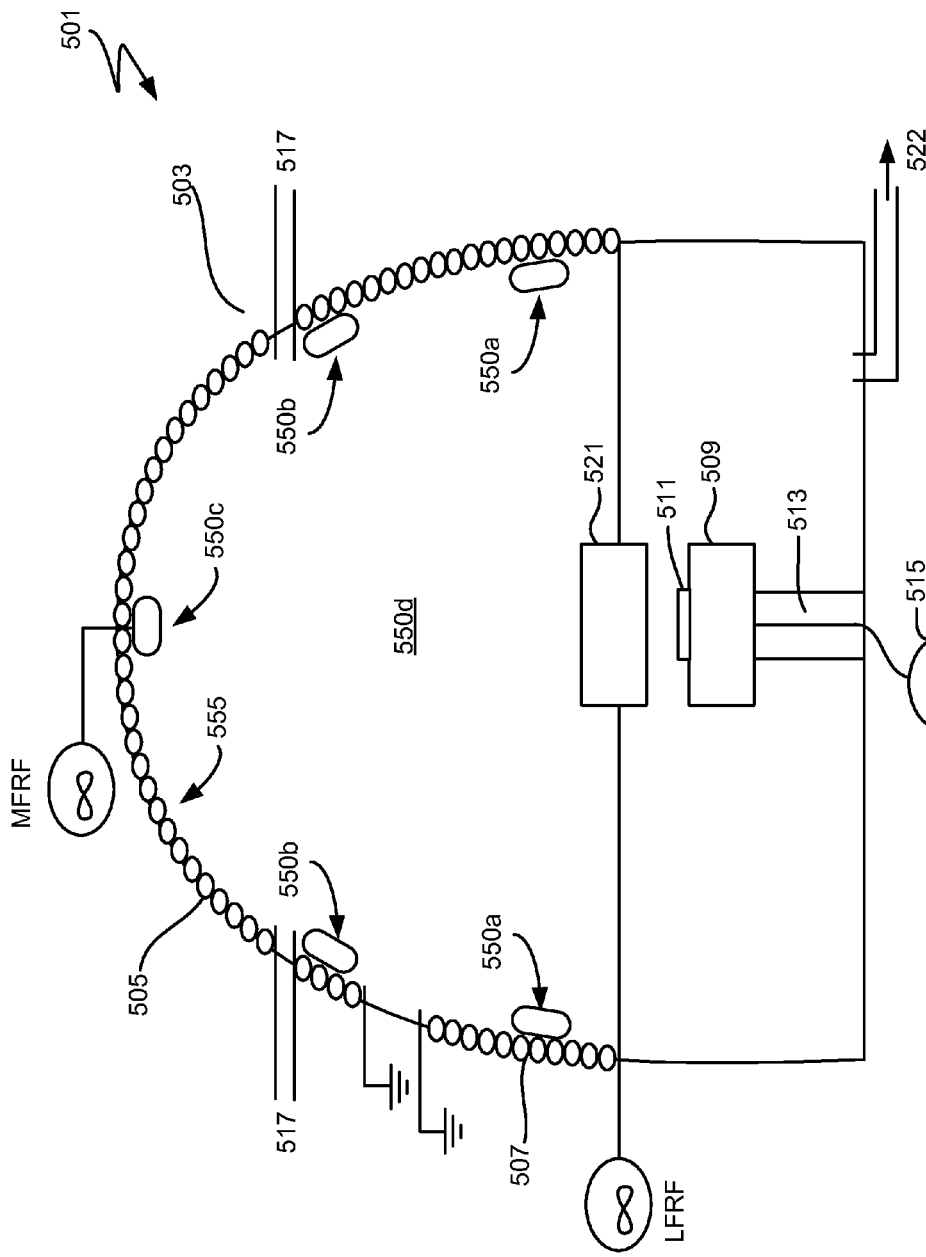

FIG. 1 is a process flow diagram depicting operations of a method in accordance with disclosed embodiments. In various embodiments, an inert gas may optionally be flowed during the operations of FIG. 1. Example inert gases include argon, helium, neon, krypton, nitrogen, and xenon. Operations may be performed in an apparatus such as a process chamber where a substrate may be housed. The process chamber may include a showerhead through which etchants may be introduced to the chamber or to a processing region of the chamber and a pedestal to support the substrate. The process chamber may include a plasma generating region or be connected to a remote plasma generator. Example process chambers are depicted in FIGS. 3, 4, and 5, which are described in further detail below.

The substrate may be a silicon wafer, e.g., 200-mm wafer, 300-mm wafer, 450-mm wafer, including wafers having one or more layers of material such as dielectric, conducting, or semi-conducting material deposited thereon. For example, the substrate may be a silicon wafer with at least one silicon nitride and at least one silicon oxide layer deposited thereon. The substrate may also include various topographical features. Such features can be characterized by one or more of narrow and/or re-entrant openings, constrictions within the feature, and high aspect ratios. In some embodiments, a feature may have an aspect ratio of at least about 2:1, at least about 10:1, at least about 20:1, at least about 50:1 or higher.

In operation 102 of FIG. 1, silicon from a silicon source is provided to a plasma, which general contains one or more etchant species or precursors thereof. Various species may be present in a plasma, such as ions, electrons, radicals, neutral species, meta-stable species, and other species. The silicon source may be provided to a plasma region, which is defined as a region at or near where plasma is generated and/or flowed. In some embodiments, the plasma region is upstream of the substrate, either inside the process chamber or outside of the process chamber. For example, a plasma region upstream of the substrate and inside the process chamber may be a region between the showerhead and the substrate or a region at or near the showerhead. Alternatively, a plasma region upstream of the substrate and outside of the process chamber may be, for example, in a remote plasma generator. In some embodiments, the plasma region may be downstream of a remote plasma generator such that silicon is introduced to the plasma downstream of the remote plasma generator. Further examples are provided below.

In some embodiments, silicon is provided from multiple sources, for example, from both a solid silicon source and a fluidic silicon source. Fluidic silicon sources include gaseous and liquid silicon sources. Liquid silicon sources may be delivered to a chamber entrained in a vapor. In some embodiments, etch selectivity of silicon nitride to silicon oxide and silicon increases by using more than one silicon source.

A solid silicon source may be any solid silicon-containing compound. Example solid silicon sources include silicon, quartz, silicon oxide, silicon germanium, silicon carbide, and combinations thereof. (In alternative embodiments, other types of solids may be used instead of a silicon-containing source, such as aluminum or titanium, but such solid sources may be used with caution to prevent contamination on the substrate.) In various embodiments, a solid silicon source may be located at or near a plasma region. In some embodiments, the location of a solid silicon source in the hardware may be chosen to improve selectivity. Examples of locations where a solid silicon source may be placed include above the substrate in a process chamber, between the substrate and an electrode, between the substrate and the showerhead, at or near the showerhead, upstream of the showerhead, in a plasma generating region of the process chamber, and in a remote plasma generator. In some embodiments, solid silicon sources are placed at one or more locations in the process chamber.

In some embodiments, a solid silicon source may be a component of the process chamber. Examples of process chamber components that may be composed of or include a solid silicon source include gas diffuser rings, adapter rings, and showerheads. A silicon source may also be an otherwise non-functional component that is attached to a process chamber wall or otherwise placed in a process chamber, plasma generator, or other appropriate plasma region. For example, a silicon rod may be placed in the chamber. In some embodiments, a solid silicon source is a component of a field retrofit kit or supplemental component that may be secured to a process chamber in a previously installed etch tool. In some embodiments, a solid silicon source may be a functional or non-functional sacrificial component of the etch apparatus hardware such that it is wholly or partially consumed during the etch process.

Silicon in operation 102 may be provided from a fluidic silicon source, either instead of or in addition to a solid silicon source. Example fluidic silicon sources include silanes such as silane ($SiH_4$), disilane ($Si_2H_6$), tetrafluorosilane or silicon tetrafluoride ($SiF_4$); and tetrachlorosilane ($SiCl_4$); tetraethyl orthosilicate (TEOS); and tetramethylsilane (($CH_3)_4Si$). As described above, fluidic silicon sources may be provided as a gas or a liquid. In some embodiments, a liquid silicon source is provided to the plasma in vapor phase. For example, a liquid silicon source such as TEOS may be vaporized in a bubbler prior to being provided to the plasma in vapor phase.

Flow rate of a fluidic silicon source may depend on the types and flow rates of the process gases used with the plasma during etch, process chamber volume, and the amount of silicon nitride to be etched on the substrate. If an etch process involves a higher flow rate of process gases, then a higher flow rate of a fluidic silicon source may be used. In some embodiments, a highly diluted fluidic silicon source (e.g., a gas with less than about 1% silicon) may be insufficient to improve selectivity. In some embodiments, at least about 9% of the composition of gases flowed to the plasma, including the silicon source, fluorinating gas, inert gas, and oxidants, is the fluidic silicon source. In some embodiments, the flow rate of the silicon-containing gas in the process chamber is less than about 10%, or less than about 5% of the total flow rate of gases flowed into the plasma region of an etching apparatus. In some embodiments, at least about 0.5% (volumetric) of a total flow of gases into a chamber housing the substrate is the silicon source. In some embodiments, other types of gases may be flowed in combination with a silicon source, such as carbon monoxide, such gases may be flowed with caution to prevent contamination on the substrate.

In operation 104, the substrate is exposed to fluorine-containing etchant species. Disclosed embodiments are suitable for improving etch selectivity when a fluorinating gas is used to generate the etching species. The fluorinating gas may be any suitable fluorine-containing etchant, such as fluorine ($F_2$), tetrafluorocarbon ($CF_4$), hexafluoroethane ($C_2F_6$), hexafluoropropylene ($C_3F_6$), octafluoropropane ($C_3F_8$), 1,3-hexafluorobutadiene ($C_4F_6$), octafluorocyclobutane ($C_4F_8$), perfluorocyclopentene ($C_5F_8$), silicon hexafluoride ($SiF_6$), and nitrogen trifluoride ($NF_3$). In various embodiments, the fluorinating gas is a non-hydrocarbon-containing fluorinating gas. When a plasma is ignited, the fluorinating gas and, in some cases, other gases in the plasma generator form an etching species. An etching species may include ions, electrons, radicals, neutral species, meta-stable species, other species, and combinations thereof. In various embodiments, the main etching species includes ions and radicals.

In some embodiments, a hydrocarbon-containing fluorinating gas having a chemical formula of $CF_x$ or $CH_xF_y$, where x and y are integers, may be used in operation 104. Examples include $CH_2F_2$, $CH_3F$, and $CHF_3$. In some such embodiments, the hydrocarbon-containing fluorinating gas may be used in addition to a non-hydrocarbon-containing fluorinating gas. For example, in some embodiments, the fluorinating gas includes a combination of $CF_4$ and $CH_2F_2$. In some embodiments, the fluorinating gas includes $CF_4$ as the only fluorine-containing compound. Inert gases may or may not be present in the gas mixture introduced to the plasma generator. For example, a combination of $CF_4$, $CH_2F_2$, $CH_3F$, $CHF_3$, and argon may be introduced to a plasma generator.

While previous selective etch techniques relied on the formation of polymers to protect certain surfaces from etching, various embodiments of the methods described may avoid using polymerizing gases. For example, if used, the percentage of a hydrocarbon-containing fluorinating gas or a carbon-containing fluorinating gas in a gas mixture may be less than about 5% while still maintaining a high etch selectivity to oxides and silicon.

In some embodiments, the methods described herein do not form a polymerizing or protection layer on the substrate, which may facilitate a more efficient etch process. However, in some embodiments, disclosed embodiments may be used to improve etch selectivity of silicon nitride in methods that also involve polymerization. For example, in processes where $CH_3F$ is used to polymerize on the surface of the substrate to protect exposed silicon oxide or poly-silicon layers, providing silicon from a silicon source to the plasma may improve etch selectivity of silicon nitride.

The substrate may also be exposed to additional process gases to facilitate the etch process, such as one or more oxidants and/or a carrier gas. During operation 104, additional processes gases used to facilitate selective etch of silicon nitride may also be introduced to the chamber. In various embodiments, one or more oxidants are flowed with the fluorinating gas or prior to flowing the fluorinating gas. Some oxidants may have a chemical formula of $NO_x$. Examples of oxidants include $O_2$, $N_2$, $N_2O$, NO, $NO_2$, and combinations thereof. In various embodiments, a combination of oxidants such as $O_2$ and $N_2O$ and a fluorinating gas, such as $CF_x$ where x is an integer (e.g., $CF_4$); $CH_xF_y$ where x and y are integers (e.g., $CH_2F_2$); $CH_3F$; $NF_3$; or combinations thereof, may be flowed in operation 104. In some embodiments, NO may be directly added to the chamber or formed by a reaction using two or more reactants. Examples of etching silicon nitride with high selectivity using NO are described in detail in U.S. patent application Ser. No. 14/576,020 filed Dec. 1, 2014, titled "SELECTIVE NITRIDE ETCH", which is herein incorporated by reference in its entirety. Unlike a carrier gas such as argon that does not generally contribute the species that etch the silicon nitride, an oxidant may contribute to the etchant species.

According to various embodiments, the plasma may or may not be generated in the region where the silicon source is introduced. For example, the plasma may be generated upstream of the silicon source, with the silicon source introduced to the plasma by flowing the plasma past a solid silicon source, mixing a fluidic silicon source with the plasma downstream of the plasma generator, etc. In some embodiments, multiple silicon sources may be introduced at different locations relative to the plasma generator. For example, a fluidic silicon source may be introduced along with a fluorinating gas to a plasma generator upstream of a process region of the process chamber, with a silicon source positioned inside the process chamber.

In various embodiments, the plasma may be any appropriate plasma including an inductively coupled plasma, a capacitively coupled plasma, microwave excited plasma, or any type of downstream plasma. In various embodiments, performing operations according to disclosed embodiments with an inductively coupled plasma may be more efficient. The plasma density of an inductively coupled plasma may be greater than the plasma density of a capacitively coupled plasma. An inductively coupled plasma may have a lower plasma energy than a capacitively coupled plasma.

A high concentration of atomic fluorine in the plasma may reduce etch selectivity. The presence of a solid silicon source may reduce the amount of atomic fluorine in the plasma, such that atomic fluorine generated from the plasma reacts with the solid silicon source rather than reacting with materials on the substrate. For example, the etching species generated from the fluorinating gas may etch silicon from the surface of a solid silicon source. Silicon from the solid silicon source may react with atomic fluorine generated in the plasma and deplete the amount of atomic fluorine present in the plasma. Likewise, when the plasma is ignited, the plasma generated from the fluorinating gas may react with the fluidic silicon source to deplete the amount of atomic fluorine present in the plasma.

Conditions of the plasma may be controlled to modulate the reaction between the etching species and the silicon source. For example, in some embodiments, the temperature of a solid silicon source may be controlled to modulate the amount of silicon etched from the solid silicon source during selective silicon nitride etch. Temperature may be controlled by changing the temperature of a component holding or attached to the silicon source during processing. Particles from some solid silicon sources may cause minor defects, depending on the conditions of the plasma generation and etching process, and as such, the plasma may be modulated to thereby modulate the etch rate of the solid silicon source and reduce defects. In the disclosed embodiments, parameters such as plasma power and frequency, flow rates of fluidic silicon sources and gases used during the etch process, temperature, pressure, location of silicon sources, surface area of solid silicon sources, and composition of solid silicon sources may be controlled to reduce the amount of defects on the substrate, and achieve high etch selectivity of silicon nitride to silicon oxide, silicon and or other exposed substrate surface materials.

In operation 106, silicon nitride on the substrate is selectively etched, with the etch selective to other exposed materials on the substrate such as silicon oxide and silicon. Introduction of silicon from the silicon source may increase or decrease the etch rate. For example, some of the etching species may react with the silicon source, thereby reducing the etch rate of silicon nitride. In other embodiments, etch rate may increase, for example if the silicon source used is a silicon fluoride ($SiF_x$) gas. When the plasma is ignited, $SiF_x$ generates silicon and fluorine plasma, whereby some fluorine plasma is used as the etching species for selectively etching silicon nitride.

Process conditions for the method described with respect to FIG. 1 depend on the substrate size, substrate composition, amounts of etch chemistry, chamber volume, and types of plasma processing tools used. The pressure of the chamber may depend on the type of plasma chamber. The chamber pressure may be maintained at a level suitable for sustaining a plasma in the chamber. In some embodiments, the temperature of a solid silicon source may be monitored and controlled to be a temperature between about 0° C. and about 500° C., or between about 10° C. and about 400° C., or about 100° C., or about 200° C., or about 300° C., or about 400° C. In some embodiments, disclosed embodiments are performed at a temperature greater than about 100° C. For example, where a solid silicon source is located at or near a coil of a plasma generator, the solid silicon source may be heated up to a temperature greater than about 300° C.

In various embodiments, the etching process in the process chamber may be performed at a temperature, such as a substrate or pedestal temperature, different than or similar to the temperature of the solid silicon source. The temperature may be the substrate temperature, which may be coupled with the pedestal temperature. The pedestal temperature may be used as a proxy for substrate temperature for the disclosed embodiments. In some embodiments, the etching process is performed at a pedestal temperature between about 0° C. and about 80° C. In some embodiments, the temperature may be higher or lower depending on the chamber volume, amount of fluorinating gas, amount of silicon sources, types of silicon sources used, and plasma processing conditions.

Returning to FIG. 1, in operation 108, operations 102-106 may be optionally repeated in cycles to selectively etch silicon nitride. Etch selectivity achieved may be at least about 100:1, or at least about 500:1, or at least about 1000:1. In some embodiments, etch selectivity is infinite.

In some embodiments, after the silicon nitride is selectively etched, post-processing is performed on the substrate. Example post-processing operations, such as defluorination, are described in U.S. patent application Ser. No. 14/576,020 filed Dec. 1, 2014, titled "SELECTIVE NITRIDE ETCH".

Figure 2A:
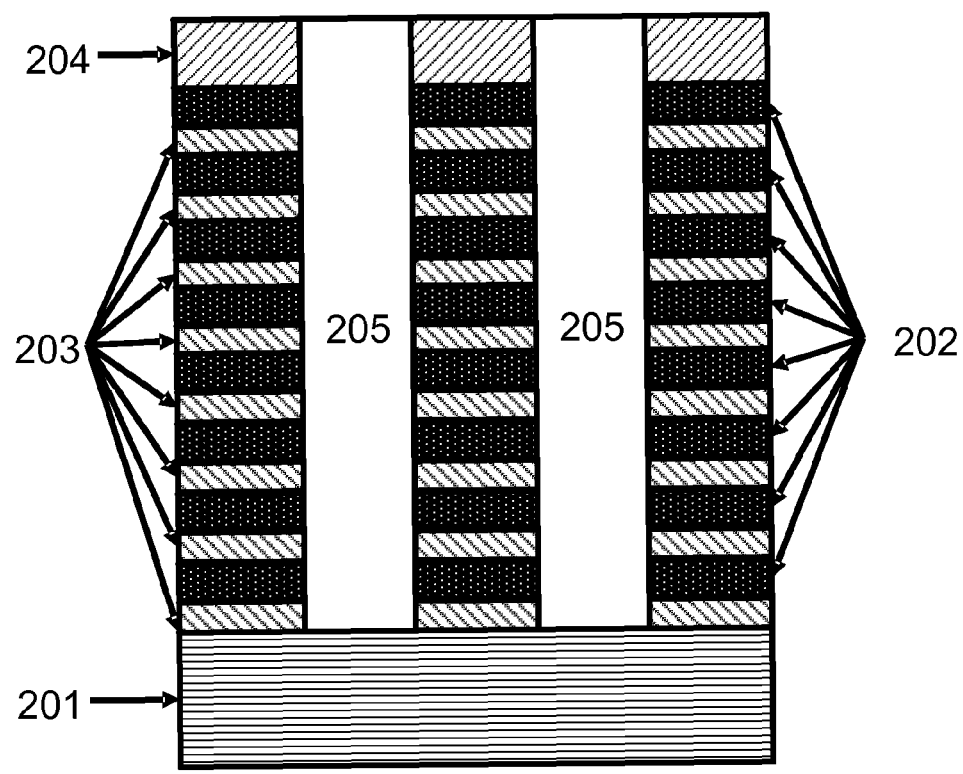
FIGS. 2A and 2B are schematic representations of an etching scheme in accordance with disclosed embodiments.
Figure 2B:
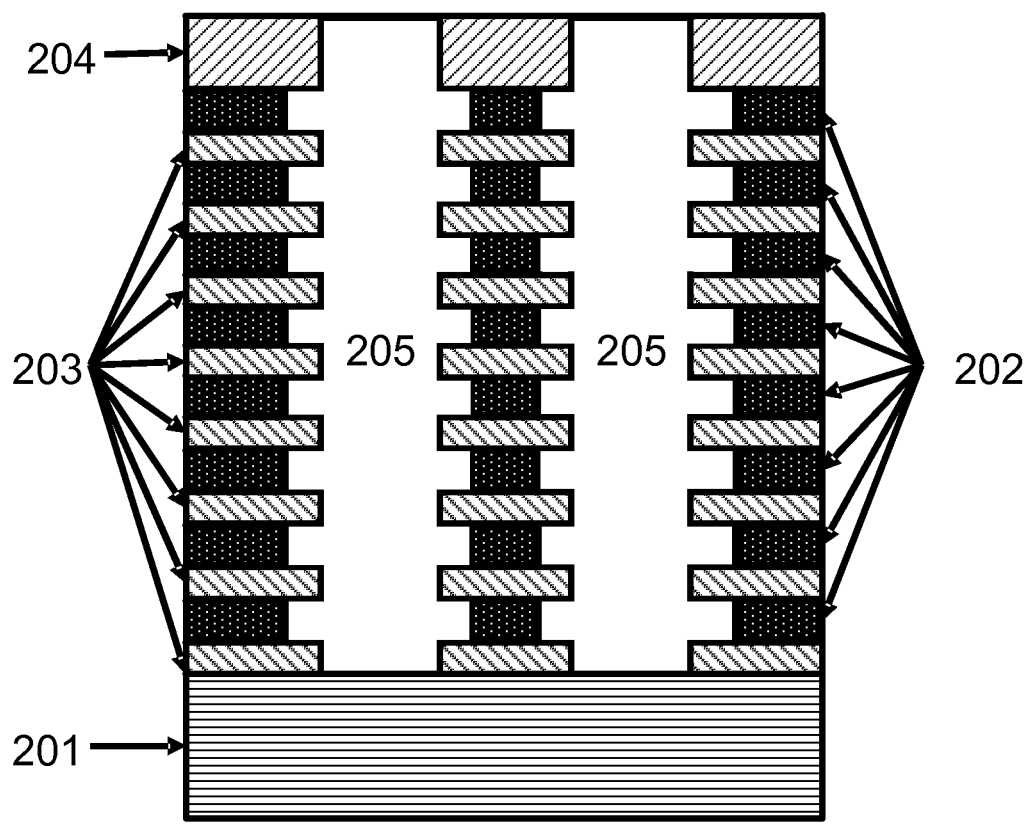

FIGS. 2A and 2B provide an example of a patterning scheme for which disclosed embodiments may be performed. FIG. 2A shows a cross section of a semiconductor substrate with a substrate layer 201, silicon nitride layers 202, silicon dioxide layers 203, and a mask layer 204. The cross section depicted in FIG. 2A has already been partially patterned to form two trenches or via holes 205. The substrate layer 201 may be the top portion of a silicon substrate, a silicon layer or another material.

FIG. 2B shows the substrate whereby exposed portions of silicon nitride layers 202 below the mask layer 204 are etched selectively to the silicon dioxide layers 203, to the mask layer 204, and to the substrate layer 201. A method such as the one described above with respect to FIG. 1 may be used to etch silicon nitride with high selectivity to form a structure such as shown in FIG. 2B.

Apparatus

Disclosed embodiments may be performed in a process chamber, such as a plasma etch chamber. For example, the methods described above may be performed in an inductively-coupled plasma or a capacitively-coupled plasma chamber, or a downstream plasma chamber.

FIG. 3 is a schematic depiction of an example of a capacitively-coupled plasma etch chamber according to various embodiments. The plasma etch chamber 300 includes an upper electrode 302 and a lower electrode 304 between which a plasma may be generated. In some embodiments, the region between upper electrode 302 and lower electrode 304 is the plasma region 350a. Silicon from a silicon source may be provided to a plasma generated in plasma region 350a. In some embodiments, a solid silicon source such as silicon adapter ring 350b, or other components of the plasma chamber may be located at or near upper electrode 302.

A substrate 399 having a silicon nitride film thereon and as described above may be positioned on the lower electrode 304 and may be held in place by an electrostatic chuck (ESC). Other clamping mechanisms may also be employed. The plasma etch chamber 300 includes plasma confinement rings 306 that keep the plasma over the substrate and away from the chamber walls. Other plasma confinement structures, e.g. as a shroud or a dome that acts an inner wall, may be employed. In some embodiments, the plasma etch chamber 300 may not include any such plasma confinement structures.

In the example of FIG. 3, the plasma etch chamber 300 includes two radio frequency (RF) sources with RF source 310 connected to the upper electrode 302 and RF source 312 connected to the lower electrode 304. Each of the RF sources 310 and 312 may include one or more sources of any appropriate frequency including 2 MHz, 13.56 MHz, 27 MHz, and 60 MHz. Gas may be introduced to the chamber 300 from one or more gas sources 314, 316, and 318. For example, the gas source 314 may include an inert gas, the gas source 316 may include an oxidant (such as nitrous oxide ($N_2O$) and oxygen ($O_2$)) and the gas source 318 may include a fluorinating gas. In another example, the gas source 314 may include an inert gas, the gas source 316 may include $O_2$ and $N_2O$ or $NO_x$ such as NO or $NO_2$, and the gas source 318 may include a fluorinating gas (e.g., $CF_4$, $CH_2F_2$). In some embodiments, silicon may be provided to the plasma from a fluidic silicon source flowing to plasma region 350a, such as through gas inlet 320. For example, gas source 314 may include a silicon-containing gas, gas source 316 may include $N_2O$ and $O_2$, and gas source 318 may include a fluorinating gas. Gases may be introduced to the chamber through inlet 320 with excess gas and reaction byproducts exhausted via exhaust pump 322. One example of a plasma etch chamber that may be employed is a 2300® Flex™ reactive ion etch tool available from Lam Research Corp. of Fremont, Calif. Further description of plasma etch chambers may be found in U.S. Pat. Nos. 6,841,943 and 8,552,334, which are herein incorporated by reference in their entireties.

Returning to FIG. 3, a controller 330 is connected to the RF sources 310 and 312 as well as to valves associated with the gas sources 314, 316, and 318, and to the exhaust pump 322. In some embodiments, the controller 330 controls all of the activities of the plasma etch chamber 300. The controller 330 may execute control software 338 stored in mass storage device 340, loaded into memory device 342, and executed on processor 344. Alternatively, the control logic may be hard coded in the controller 330. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. Control software 338 may include instructions for controlling the timing, mixture of gases, gas flow rates, chamber pressure, chamber temperature, solid silicon source temperature, wafer or pedestal temperature, RF frequency, RF power levels, substrate pedestal, chuck and/or susceptor position, and other parameters of a particular process performed by plasma etch chamber 300. Control software 338 may be configured in any suitable way. For example, various process tool component subroutines or control objects may be written to control operation of the process tool components used to carry out various process tool processes. The control software 338 may be coded in any suitable computer readable programming language.

In some embodiments, the control software 338 may include input/output control (IOC) sequencing instructions for controlling the various parameters described above. Other computer software and/or programs stored on mass storage device 340 and/or memory device 342 associated with the controller 330 may be employed in some embodiments. Examples of programs or sections of programs for this purpose include a process gas control program, a pressure control program, and RF source control programs.

A process gas control program may include code for controlling gas composition (e.g., fluorinating gases, fluidic silicon sources, oxidants, as described herein) and flow rates and optionally for flowing gas into a chamber prior to etch to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 330. The user interface may include a display screen, graphical software displays of the apparatus and/or process conditions, and user input devices such as pointing devices, keyboards, touch screens, microphones, etc.

In some embodiments, parameters adjusted by controller 330 may relate to process conditions. Non-limiting examples include process gas composition and flow rates, pedestal temperature, solid silicon source temperature, pressure, plasma conditions (such as RF bias power levels, current in zones of a multi-zone coil), etc. These parameters may be provided to the user in the form of a recipe, which may be entered utilizing the user interface.

Signals for monitoring the process may be provided by analog and/or digital input connections of system controller 330 from various process tool sensors. The signals for controlling the process may be output on the analog and digital output connections of the plasma etch chamber 300. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 330 may provide program instructions for implementing the above-described selective etch processes.

The program instructions may control a variety of process parameters, such as RF bias power level, current in zones of a multi-zone coil, pressure, pedestal temperature, solid silicon source temperature, gas flow rate, etc. The instructions may control the parameters to selectively etch silicon nitride films according to various embodiments described herein.

A controller 330 will typically include one or more memory devices and one or more processors configured to execute the instructions so that the apparatus will perform a method in accordance with disclosed embodiments. Machine-readable media including instructions for controlling process operations in accordance with disclosed embodiments may be coupled to the controller 330, for example, as described above.

In some implementations, the controller 330 may be or form part of a system controller that is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, a strip chamber or module, and any other semiconductor processing systems that may be associated or used in the fabrication and/or manufacturing of semiconductor wafers.

As noted above, depending on the process step or steps to be performed by the tool, the system controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Alternatively, disclosed embodiments can be carried out in an inductiviely-coupled plasma etch chamber such as chamber 400 shown in FIG. 4. The chamber 400 includes an interior 402 maintained at a desired vacuum pressure by a vacuum pump connected to an outlet 404 in a lower wall of the chamber. Interior 402 includes a plasma region 450 where plasma may be generated. A solid silicon source may be a component of chamber 400, or attached to components of the chamber 400. In some embodiments, a solid silicon source such as adapter ring 450a may be placed at or near gas distribution plate 424 or at or near the cylindrical or conical heated liner 426. In some embodiments, the solid silicon source may be a diffuser ring (not shown), a rod (not shown), or a silicon piece (not shown) in the chamber 400

Etching gas such as a fluorinating gas can be supplied to a showerhead arrangement to supply gas from one or more gas sources 406 to a plenum 408 extending around the underside of a dielectric window 410. A fluidic silicon source may also be supplied to the showerhead arrangement to a plenum 408. A high density plasma can be generated in the chamber by supplying RF energy from an RF source 412 to an external RF antenna 414 such as a planar spiral coil having one or more turns outside the dielectric window 410 on top of the chamber. The plasma generating source can be part of a modular mounting arrangement removably mounted in a vacuum tight manner on the upper end of the chamber.

A semiconductor substrate 416 such as a substrate including silicon nitride is placed within the chamber on the substrate support 418 such as a cantilever chuck arrangement removably supported by a modular mounting arrangement from a sidewall of the chamber. The substrate support 418 can include a bottom electrode for supplying an RF bias to the substrate during processing thereof.

The substrate support 418 is at one end of a support arm mounted in a cantilever fashion such that the entire substrate support/support arm assembly can be removed from the chamber by passing the assembly through an opening in the sidewall of the chamber. The substrate support 418 can include a chucking apparatus such as an electrostatic chuck 420 and the substrate 416 can be surrounded by a dielectric focus ring 422. The chuck can include an RF biasing electrode for applying an RF bias to the substrate during an etching process. The etching gas and a fluidic silicon source supplied by one or more gas sources 406 can flow through channels between the window 410 and an underlying gas distribution plate 424 and enter the interior 402 through gas outlets in the plate 424. For example, a fluidic silicon source such as silane gas may be flowed from gas source 406 through gas distribution plate 424 to plasma region 450. The chamber can also include a cylindrical or conical heated liner 426 extending from the plate 424.

A system controller as described above with respect to FIG. 3 may be implemented with the etch chamber in FIG. 4.

FIG. 5 is a simplified illustration of various components of an alternative etch reactor 501 that may be used for performing disclosed embodiments. As shown, reactor 501 includes a process chamber 503 which encloses other components of the reactor 501 and serves to contain the plasma. In one example, the process chamber walls are made from aluminum, aluminum oxide, and/or other suitable material. The embodiment shown in FIG. 5 has two plasma sources: top RF coil 505 and side RF coil 507. In some embodiments, this coil configuration may be a multi-zone coil where the top RF coil 505 constitutes one zone and the side RF coil 507 constitutes another zone. Top RF coil 505 is a medium frequency or MFRF coil and side RF coil 507 is a low frequency or LFRF coil. In the embodiment shown in FIG. 5, MFRF frequency may be from 430-470 kHz and LFRF frequency from 340-370 kHz. However, apparatuses having single plasma sources may be used.

Solid silicon sources 550a and 550b may be placed along the walls 555 of the reactor at or near the top RF coil 505 and side RF coil 507. In some embodiments, solid silicon sources 550a and 550b are adapter rings. In some embodiments, a solid silicon source is a silicon diffuser ring 550c.

In various embodiments, gas may be introduced to the reactor 501 from one or more gas sources (not shown). For example, a fluidic silicon source may be introduced to the reactor 501 into plasma region 550d. A gas source may also include an inert gas, another gas source may include an oxidant (such as $N_2O$ and $O_2$) and another gas source may include a fluorinating gas (e.g., $CF_4$). Such gases may be introduced to the reactor 501 and generate a plasma in plasma region 550d. In one example, a silicon-containing gas such as silane, an inert gas, an oxidant, and a fluorinating gas are introduced into the reactor 501 to generate a plasma at or near the plasma region 550d.

Within the reactor, a wafer pedestal 509 supports a substrate 511. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged etching species onto the substrate for an etch operation in some embodiments. Electrical energy from source 515 is coupled to substrate 511 via an electrode or capacitive coupling, for example. Note that the bias applied to the substrate need not be an RF bias. Other frequencies and DC bias may be used as well. In various embodiments, a bias is not used during the etch process.

A system controller as described above with respect to FIG. 3 may be implemented with the etch chamber in FIG. 5.

Reactors and modules such as those describe above with respect to FIGS. 3, 4, and 5 may be in an apparatus or tool. Generally, the apparatus may include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck, and/or other wafer holding apparatus. For certain operations in which the wafer is to be heated, the apparatus may include a heater such as a heating plate.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment that shows that the presence of a silicon source improves etch selectivity of silicon nitride to silicon oxide and poly-silicon was conducted. Three processes were tested, with each process tested in two different chamber environments. One chamber environment was used to perform the processes without a silicon source. Another chamber environment was used to perform the processes with a silicon source. In the silicon source chamber, 10 solid silicon chips were secured to walls of a plasma generator (similar to that described above with respect to FIG. 5) near the coils.

In Process A, a substrate including silicon nitride, silicon oxide, and poly-silicon was exposed to $N_2O$, $O_2$, and $CF_4$ at a pedestal temperature of 10° C. and a chamber pressure of 1.5 Torr using an inductively-coupled plasma at plasma power of 2000 W.

In Process B, a substrate including silicon nitride, silicon oxide, and poly-silicon was exposed to $N_2O$, $O_2$, $CF_4$, and $CH_2F_2$ at a pedestal temperature of 10° C. and a chamber pressure of 1.5 Torr using an inductively-coupled plasma set at plasma power of 2000 W.

In Process C, a substrate including silicon nitride, silicon oxide, and poly-silicon was exposed to $N_2O$, $O_2$, $CF_4$, and at a different ratio of $CF_4/CH_2F_2$ at a pedestal temperature of 10° C. and a chamber pressure of 1.5 Torr using an inductively-coupled plasma set at plasma power of 2000 W.

The etch selectivity of silicon nitride to oxide is summarized in the table and bar graph in FIG. 6A. As shown, for every process, etch selectivity improved with the presence of a silicon source—for Process A, etch selectivity improved from 33 to 47; for Process B, etch selectivity improved from 56 to 2000; and for Process C, etch selectivity improved from 57 to 1168.

Figure 6B:
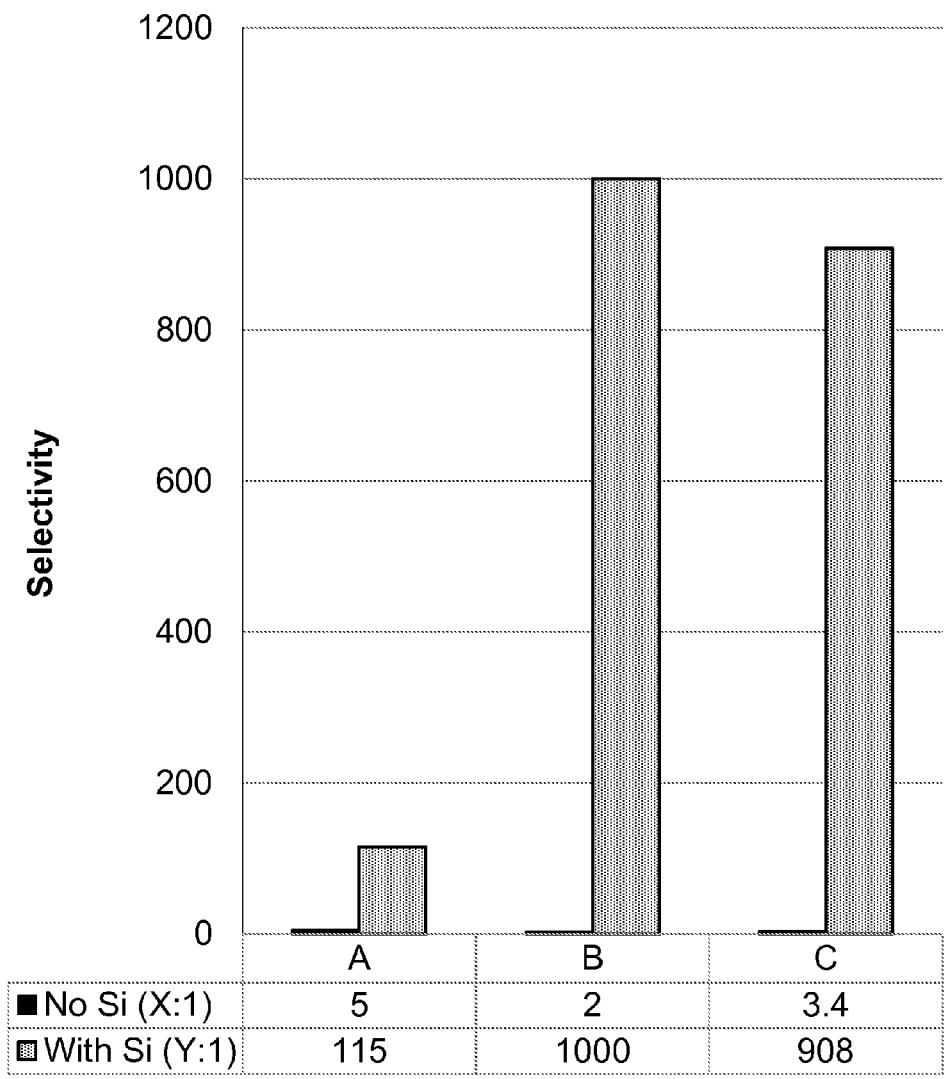

The etch selectivity of silicon nitride to poly-silicon is summarized in the table and bar graph in FIG. 6B. Like the selectivity to oxide results shown in FIG. 6A, for every process, etch selectivity improved with the presence of a silicon source—for Process A, etch selectivity improved from 5 to 115; for Process B, etch selectivity improved from 2 to 2000; and for Process C, etch selectivity improved from 3.4 to 908.

Experiment 2

An experiment comparing etch selectivity of silicon nitride to TEOS and poly-silicon with and without use of a silicon source was conducted. The experiments for a first set of trials were conducted at a pressure of 1.5 Torr, with an inductively coupled plasma (ICP) set at a power of 2000 W. $N_2O$ and $O_2$ were flowed to facilitate etch at a pedestal temperature of 10° C.

In the first set of trials, a substrate including a layer of silicon nitride deposited by plasma-enhanced chemical vapor deposition (PECVD), tetraethyl orthosilicate (TEOS), and poly-silicon was exposed to carbon tetrafluoride ($CF_4$) and a mixture of oxygen and nitrous oxide ($O_2/N_2O$) without a silicon source. Selectivities for these six tests are summarized in Table 1.

TABLE 1

Silicon Nitride Etch Selectivity Without Si-Source

| | | Etch Rate (Å/min) | | | | Selectivity | |
| --- | --- | --- | --- | --- | --- | --- | --- |
| Trial # | Flow Rate Ratio of $CF_x/CH_xF_y$ | LP SiN | PECVD-deposited SiN | TEOS | Poly-Si | LP SiN/ TEOS | LP SiN/ poly |
| 1 | 1.85 | 202.8 | 592.4 | 3.5 | −59.6 | 57.4 | −3.4 |
| 2 | 1.5 | 172.3 | 960.1 | 3.1 | 293.9 | 56.2 | 0.6 |
| 3 | 1.2 | 178.7 | 933.2 | 2.7 | 180.9 | 67.0 | 1.0 |
| 4 | 1 | 164.3 | 859.0 | 2.3 | 125.1 | 70.4 | 1.3 |
| 5 | 0.8 | 208.4 | 685.8 | 2.1 | 78.9 | 100.8 | 2.6 |
| 6 | 0.6 | 196.0 | 399.0 | 1.7 | 115.7 | 117.6 | 1.7 |

The experiments for a second set of trials were conducted at a pressure of at least 1 Torr, with ICP power of about 1000 W. For the etch process, about 10,000 sccm of $N_2O$ and $O_2$ together were flowed to the chamber to facilitate etch.

In the second set of trials, a substrate including a layer of PECVD-deposited silicon nitride, TEOS, and poly-silicon was exposed to $CF_4$ and $O_2/N_2O$ in a chamber with 10 solid silicon chips attached near the coils against the walls of the remote plasma generator. The etch selectivities for these tests are summarized in Table 2.

TABLE 2

Silicon Nitride Etch Selectivity With Si-Source

| | | | Etch Rate (Å/min) | | | | |
| --- | --- | --- | --- | --- | --- | --- | --- |
| | Flow Rate Ratio of | Ar Flow Rate | PECVD-deposited | | | Selectivity | |
| Trial # | $CF_x/CH_xF_y$ | (sccm) | SiN | TEOS | Poly-Si | SiN/TEOS | SiN/poly |
| 1 | 1.5 | 0 | 232.2 | −1.7 | −0.5 | >1000 | >1000 |
| 2 | 1.5 | 300 | 385.9 | −0.6 | 0.7 | >1000 | 578.8 |
| 3 | 1.8 | 0 | 544.9 | 0.5 | 0.6 | 1167.6 | 908.1 |
| 4 | 1.7 | 0 | 534.2 | 0.8 | 0.6 | 667.8 | 890.3 |
| 5 | 1.7 | 300 | 666.3 | 1.4 | 0.6 | 476.0 | 1110.6 |

Note the substantial increase in selectivity shown in Table 2 versus Table 1. The etch selectivities in Table 2 of silicon nitride to both TEOS and poly-silicon were at least 400, and in some trials, greater than 1000.

Experiment 3

An experiment comparing etch selectivity of silicon nitride to TEOS and poly-silicon with and without use of a silicon diffuser source was conducted. A first set of trials was conducted that determined the etch selectivity of silicon nitride to TEOS without a silicon source. A substrate including silicon nitride and TEOS was exposed to 100 sccm of $NF_3$, 2000 sccm of $N_2$, 3000 sccm of $N_2O$, and 4900 sccm of $O_2$ at a chamber pressure of 1.5 Torr and a pedestal temperature of 10° C. at 2000 W ICP plasma for 45 seconds. The substrate was then exposed to 4750 sccm of $N_2O$ and 4750 sccm of $O_2$ at 2000 W ICP plasma power while a 1000 W bias was applied for a duration of 45 seconds at the same chamber pressure and pedestal temperature. The selectivity of SiN to TEOS was determined to be 65:1.

A second set of trials was conducted that determined the etch selectivity of silicon nitride to TEOS with a silicon source diffuser ring in a plasma generator (similar to that described above with respect to FIG. 5.) A substrate including silicon nitride and TEOS was exposed to $NF_3$, $N_2$, $N_2O$, and $O_2$ at a chamber pressure of 1.5 Torr and a pedestal temperature of 10° C. at 2000 W ICP plasma for 45 seconds. The substrate was then exposed to the same gas flow at 2000 W ICP plasma power while a 1000 W bias was applied for a duration of 45 seconds at the same chamber pressure and pedestal temperature. The selectivity of SiN to TEOS was determined to be infinite.

Experiment 4

In another experiment, a non-$N_2O$-based chemistry was used in a capacitively coupled plasma at sub-torr pressure with no ICP power. The chamber pressure was set at 500 mTorr, 100 sccm $CF_4$ was flowed to the chamber, and a bias was applied at a power of 200 W at 100° C. for 30 seconds. In one trial, the plasma was generated in a ceramic dome and no silicon source was provided. The selectivity of silicon nitride to oxide was 2.3, and the selectivity of silicon nitride to poly-silicon was 0.85 (i.e., poly-silicon etched faster than silicon nitride). In a second trial, the plasma was generated in a ceramic dome including a silicon source. The selectivity of silicon nitride to oxide was 2.9, and the selectivity of silicon nitride to poly-silicon was 1.56 (poly-silicon etched slower than silicon nitride). The poly-silicon etch rate was reduced by 44%. These results indicate that disclosed embodiments improve etch selectivity for non-$N_2O$ based silicon nitride etch processes.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching silicon nitride on a substrate, the method comprising:
   (a) introducing a fluorinating gas to a plasma generator and igniting a plasma to form fluorine-containing etching species; and
   (b) providing silicon to the plasma from a solid silicon source, the solid silicon source having only the function of providing silicon to the plasma; and
   (c) exposing the silicon nitride to the fluorine-containing etching species to selectively etch the silicon nitride relative to other silicon-containing materials on the substrate.

2. The method of claim 1, wherein the solid silicon source is provided to the plasma upstream of the substrate.

3. The method of claim 1, wherein the solid silicon source is provided to the plasma in a remote plasma generator.

4. The method of claim 1, wherein the solid silicon source is provided to the plasma between the substrate and a showerhead of a chamber housing the substrate.

5. The method of claim 1, wherein the solid silicon source is provided to the plasma at or near a showerhead of a chamber housing the substrate.

6. The method of claim 1, wherein the solid silicon source comprises two or more silicon sources.

7. The method of claim 1, wherein the solid silicon source is attached to a wall of the plasma generator.

8. The method of claim 1, wherein the fluorinating gas is selected from the group consisting of $F_2$, $SF_6$, $CF_4$, $CHF_3$, $CH_2F_2$, $NF_3$, and combinations thereof.

9. The method of claim 1, wherein the solid silicon source is a silicon-containing compound selected from the group consisting of quartz, silicon, silicon germanium, silicon carbide, and silicon oxide.

10. The method of claim 1, wherein the solid silicon source is a ring.

11. The method of claim 1, wherein the solid silicon source is a rod.

12. The method of claim 1, wherein (b) further comprises providing additional silicon to the plasma from a fluidic silicon source.

13. The method of claim 12, wherein the fluidic silicon source is a non-fluorinating fluidic silicon source.

14. The method of claim 13, wherein the non-fluorinating fluidic silicon source is selected from the group consisting of silane, disilane, tetraethyl orthosilicate, and tetramethyl silane.

15. The method of claim 13, wherein the non-fluorinating fluidic silicon source is a silicon-containing gas and the flow rate of the silicon-containing gas to a process chamber housing the substrate is less than about 10% of the total flow rate of gases flowed into the process chamber.

16. The method of claim 12, wherein at least about 0.5% of a total flow of gases by volume introduced to the plasma is the fluidic silicon source.

17. The method of claim 13, wherein the fluidic silicon source is a gaseous silicon source.

18. The method of claim 13, wherein the fluidic silicon source is a liquid silicon source.

19. The method of claim 13, wherein the fluorine-containing etching species reacts with the fluidic silicon source to deplete an amount of atomic fluorine present in the plasma.

20. The method of claim 1, further comprising introducing one or more oxidant gases during (b).

* * * * *